US010490555B2

(12) United States Patent
Chang et al.

(10) Patent No.: US 10,490,555 B2
(45) Date of Patent: Nov. 26, 2019

(54) METHOD OF FORMING SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Yi-Ching Chang, Pingtung County (TW); Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/990,811

(22) Filed: May 28, 2018

(65) Prior Publication Data

US 2019/0013321 A1    Jan. 10, 2019

(30) Foreign Application Priority Data

Jul. 7, 2017    (CN) .......................... 2017 1 0549871

(51) Int. Cl.
*H01L 27/108* (2006.01)
*H01L 21/762* (2006.01)
*H01L 29/06* (2006.01)

(52) U.S. Cl.
CPC .. *H01L 27/10876* (2013.01); *H01L 21/76289* (2013.01); *H01L 27/10823* (2013.01); *H01L 27/10885* (2013.01); *H01L 27/10888* (2013.01); *H01L 27/10894* (2013.01); *H01L 29/0649* (2013.01)

(58) Field of Classification Search
CPC .......... H01L 21/76289; H01L 29/0649; H01L 27/10885; H01L 27/10888; H01L 27/10894; H01L 27/10876
See application file for complete search history.

(56) References Cited

U.S. PATENT DOCUMENTS 10,074,656 B1 *    9/2018   Wang ................ H01L 27/10885
2002/0030209 A1 *  3/2002   Sugiyama ......... H01L 27/10888
                                                    257/296

(Continued)

OTHER PUBLICATIONS

Chang, Title of Invention: Method of Forming Semiconductor Memory Device, U.S. Appl. No. 15/937,849, filed Mar. 27, 2018.

*Primary Examiner* — Joseph C. Nicely
(74) *Attorney, Agent, or Firm* — Winston Hsu (57) ABSTRACT

A method of forming semiconductor memory device includes the following steps. Firstly, a substrate is provided and the substrate includes a cell region. Then, plural bit lines are disposed within the cell region along a first direction, with each of the bit line includes a tri-layered spacer structure disposed at two sides thereof. Next, plural of first plugs are formed within the cell region, with the first plugs being disposed at two sides of each bit lines. Furthermore, plural conductive patterns are formed in alignment with each first plugs. Following theses, a chemical reaction process is performed to modify the material of a middle layer of the tri-layered spacer structure, and a heat treatment process is performed then to remove the modified middle layer, thereto form an air gap layer within the tri-layered spacer structure.

11 Claims, 8 Drawing Sheets

(56) References Cited

U.S. PATENT DOCUMENTS

| | | | |
|---|---|---|---|
| 2014/0054659 A1* | 2/2014 | Seo | H01L 29/41775 257/288 |
| 2015/0056801 A1* | 2/2015 | Park | H01L 21/76814 438/655 |
| 2015/0061134 A1* | 3/2015 | Lee | H01L 21/764 257/751 |
| 2015/0126013 A1* | 5/2015 | Hwang | H01L 27/10888 438/381 |
| 2015/0214291 A1* | 7/2015 | Park | H01L 24/02 257/503 |
| 2015/0228754 A1* | 8/2015 | Sung | H01L 29/6656 438/595 |
| 2015/0255466 A1* | 9/2015 | Hwang | H01L 21/02164 438/586 |
| 2016/0027727 A1* | 1/2016 | Kim | H01L 21/764 257/774 |
| 2016/0181143 A1* | 6/2016 | Kwon | H01L 27/1052 438/586 |
| 2016/0362783 A1* | 12/2016 | Tolle | C23C 16/4405 |
| 2017/0005097 A1* | 1/2017 | Kim | H01L 23/528 |
| 2017/0005166 A1* | 1/2017 | Park | H01L 29/0649 |
| 2018/0190793 A1* | 7/2018 | Profijt | H01L 29/66666 |

\* cited by examiner

METHOD OF FORMING SEMICONDUCTOR MEMORY DEVICE

BACKGROUND OF THE INVENTION

1. Field of the Invention

The present invention relates to a method of forming a semiconductor memory device, and more particularly, to a method of forming a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. For example, the reduced line-width also increases the line resistance (R). Furthermore, the shrunk spaces between wires also increase the parasitic capacitance (C), so that, the RC delay is therefore increase to achieve poor efficiency. Therefore, there is still a need to provide an improved memory cell with a buried gate to gain enhanced performance and reliability of the corresponding memory device.

SUMMARY OF THE INVENTION

It is one of the primary objectives of the present invention to provide a method of forming a semiconductor memory device, in which, a two-stepped chemical reaction process is performed to form an air-gap layer in a spacer structure between the bit lines and the storage node (SN) contact. Through this performance, the method of the present invention is allowable to form such air-gap layer between the bit lines and the storage node contacts under a simplified process flow, so as to use the air-gap layer to improve the RC delay issues.

To achieve the purpose described above, the present invention provides a method of forming a semiconductor memory device including the following steps. First of all, a substrate is provided, and the substrate includes a periphery region and a memory cell region. Then, a plurality of bit lines is formed to extend along a first direction on the substrate, within the memory cell region, wherein a spacer structure is formed at two sides of each of the bit lines and the spacer structure includes a tri-layer structure. Next, a plurality of first plugs is formed on the substrate within the memory cell region, at two sides of each of the bit lines. Following these, a plurality of conductive patterns is formed in alignment and directly in contact with the first plugs. After forming the conductive patterns, a first chemical reaction is performed to transform a second spacer of the tri-layer structure of the spacer structure. Finally, a heat treatment process is performed to remove the transformed second spacer to form an air-gap layer in the spacer structure.

Overall speaking, the semiconductor memory device of the present invention further performs a two-stepped chemical reaction after forming the storage node pads, to firstly transform the particular spacer followed by removing the transformed spacer via a vaporization process. Through this arrangement, the present invention is able to form the air-gap layer in the spacer structure between the bit lines and the storage node contacts, under a simplified process. That is, the RC delay issue may be improved. Also, since the chemical reaction is specifically performed on the particular spacer within the spacer structure, no other elements may be damage during removing the transformed spacer. That is, the method of the present invention is allowable to form the air-gap layer without causing any damages to any other elements.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic diagrams illustrating a method of forming a semiconductor memory device according to a preferred embodiment of the present invention, in which:

DETAILED DESCRIPTION

To provide a better understanding of the presented invention, preferred embodiments will be described in detail. The preferred embodiments of the present invention are illustrated in the accompanying drawings with numbered elements.

Please refer to FIG. 1 to FIG. 8, which are schematic diagrams illustrating a forming process of a semiconductor memory device according to the preferred embodiment of the present invention, in which FIG. 1, FIG. 3, FIG. 5 and FIG. 7 show a top view of a semiconductor memory device during different forming steps respectively, and others show a cross-sectional view of a semiconductor memory device during different forming steps respectively.

The semiconductor memory device of the present embodiment for example includes a dynamic random access memory (DRAM) device, and which includes at least one transistor (not shown in the drawings) and at least one capacitor (not shown in the drawings), thereto serve as the smallest unit in the DRAM array for accepting signals from word lines (WLs, not shown in the drawings) and bit lines (BLs) 160 during the operation.

The semiconductor memory device includes a substrate 100 such as a silicon substrate, a silicon-containing substrate like a SiC or SiGe substrate, or a silicon-on-insulator (SOI) substrate, and a memory cell region 100A and a periphery region 100B are defined on the substrate 100. Also, at least one shallow trench isolation (STI) 103 is formed in the substrate 100, and which may be formed both in the memory cell region 100A and in the periphery region 100B, so as to define a plurality of active areas (AAs) 101 in the substrate 100. The formation of the shallow trench isolation 103 may be accomplished by first performing an etching process to form a plurality of trenches (not shown in the drawings) in the substrate 100, followed by filling an insulating material such as silicon oxide (SiO) or silicon oxynitride (SiON) in the trenches to form the shallow trench isolations 103. The substrate 100 further includes a plurality buried gates (not shown in the drawings) within the memory cell region 100A, with each of the buried gates preferably extending along a first direction D1 to cross each active areas 101, so that, the buried gates may therefore function like buried word lines (BWL, not shown in the drawings) of the semiconductor memory device.

Figure 1:
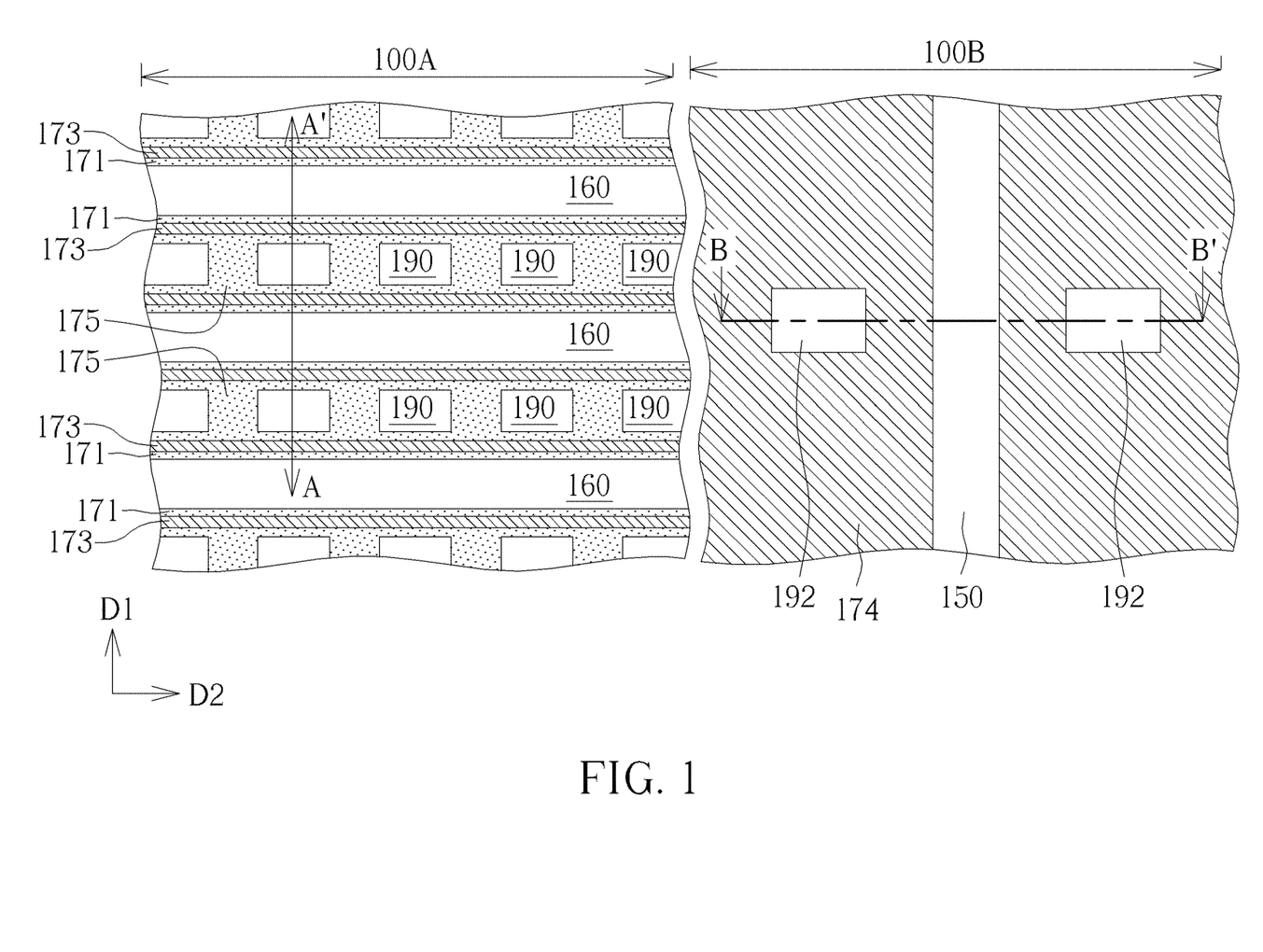
FIG. 1 shows a top view of a semiconductor memory device at the beginning of the forming process.

As shown in FIG. 1, a plurality of bit lines 160 is formed on the substrate 100 within the memory cell region 100A, and the bit lines 160 are parallelly extended along a second direction D2 being perpendicular to the first direction D1, to cross the active areas 101 and the buried word lines within the substrate 100 simultaneously. Precisely, each of the bit lines 160 includes a semiconductor layer 162, a barrier layer (not shown in the drawings), a metal layer 164 and a mask layer 166 stacked one over another on the substrate 100. Also, a part of the bit lines 160 further includes a bit line contact (BLC) formed below the bit lines 160, and the bit line contact and the semiconductor layer 162 of the bit lines 160 are monolithic.

Figure 2:
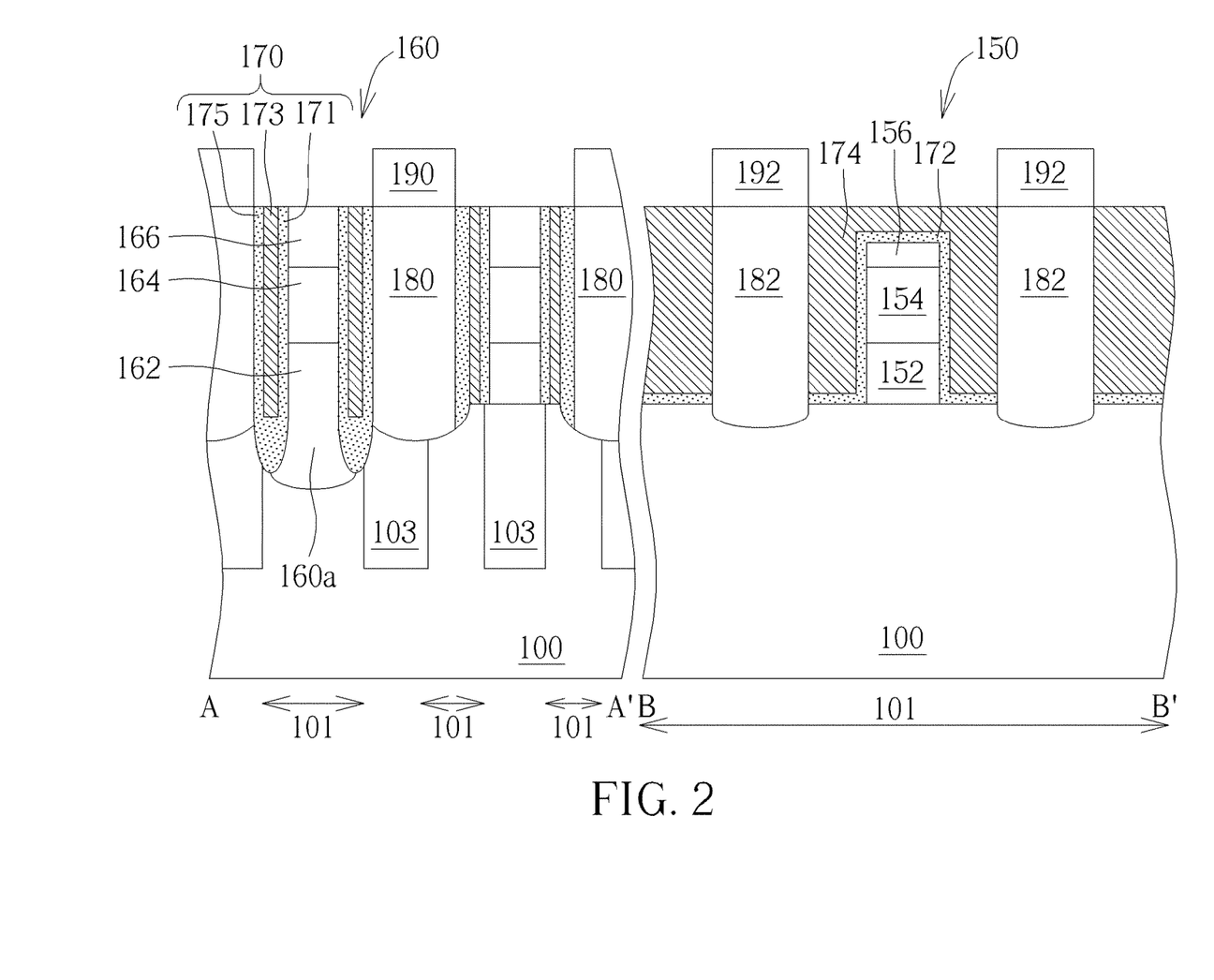
FIG. 2 shows a cross-sectional view of a semiconductor memory device taken along cross lines A-A' and B-B' in FIG. 1.

On the other hand, a gate structure 150 is formed on the substrate 100 within the periphery region 100B while forming the bit lines 160 within the memory cell region 100A. The gate structure 150 extends along the first direction D1, and which includes a gate dielectric layer (not shown in the drawings), a gate layer 152, a barrier layer (not shown in the drawings), a metal layer 154 and a mask layer 156 stacked one over another on the substrate 100, as shown in FIG. 1. The formation of the gate structure 150 is preferably integrated with the formation of the bit lines 160. For example, the gate layer 152 of the gate structure 150 and the semiconductor layer 162 of the bit lines 160 are formed simultaneously, so that, the gate layer 152 and the semiconductor layer 162 may both include polysilicon or amorphous silicon. The barrier layers of the gate structure 150 and the bit lines 160 are for example formed simultaneously, so that the barrier layers may both include titanium (Ti) or titanium nitride (TiN). The metal layer 154 of the gate structure 150 and the metal layer 164 of the bit lines 160 are for example formed simultaneously, so that, the metal layer 154 and the metal layer 164 may both include a low-resistant metal material like tungsten (W), aluminum (Al) or copper (Cu). The mask layer 156 of the gate structure 150 and the mask layer 166 of the bit lines 160 are for example formed simultaneously, so that, the mask layer 156 and the mask layer 166 may both include silicon oxide, silicon nitride or silicon carbonitride (SiCN), as shown in FIG. 2.

Moreover, a plurality of plugs 180 is formed on the substrate 100, within the memory cell region 100A, and each of the plugs 180 includes a silicide layer (not shown in the drawings) being directly in contact with the substrate 100 and/or the shallow trench isolation 103, a barrier layer (not shown in the drawings) and a metal layer (not shown in the drawings), so as to serve as a storage node contact (SNC) which is electrically connected to a source/drain region (not shown in the drawings) of the transistor. On the other hand, a plurality of plugs 182 is also formed on the substrate 100, within the periphery region 100B, to electrically connect two source/drain regions (not shown in the drawings) respectively at two sides of the gate structure 150. In one embodiment, the formation of the plugs 182 may be integrated with the formation of the plugs 180, so that, each of the plugs 182 may also include a silicide layer (not shown in the drawings), a barrier layer (not shown in the drawings) and a metal layer (not shown in the drawings) for example including a low-resistant metal like tungsten, aluminum or copper.

It is noted that, each of the plugs 180 and each of the bit lines 160 formed within the memory cell region 100A are alternately arranged along the first direction D1, and a spacer structure 170 is formed between each of the plugs 180 and each of the bit lines 160 to isolated therefrom. The spacer structure 170 preferably includes a multilayer structure, such as a tri-layer structure as shown in FIGS. 1-2 including a first spacer 171, a second spacer 173 and third spacer 175. The first spacer 171 and the third spacer 175 preferably include a material which is different from that of the second spacer 173, such as silicon nitride, and the second spacer 173 for example includes silicon oxide, but not limited thereto. In one embodiment, the spacer structure 170 is for example formed after forming the bit lines 160 and the gate structure 150, and the formation of the spacer structure 170 is for example carried out by sequentially forming a first material layer (not shown in the drawings) such as including silicon nitride, and a second material layer (not shown in the drawings) such as including silicon oxide, on the substrate 100 both within the memory cell region 100A and the periphery region 100B, to cover the bit lines 160 and the gate structure 150, followed by performing an etching process to partially remove the first material layer and the second material layer, to form the first spacer 171, the second spacer 173 and the third spacer 175 only at two sides of each bit line 160 in the memory cell region 100A. At the same time, an insulating layer 172, 174 are sequentially formed in the periphery region 100B, to cover the gate structure 150. Then, the plugs 180, 182 are formed respectively in the memory cell region 100A and the periphery region 100B, with each of the plugs 180, 182, the spacer structure 170 and the bit lines 160 both having a level top surface, as shown in FIG. 2.

Next, a deposition process and a patterning process are sequentially performed, to form a plurality of conductive patterns 190, 192 in the memory cell region 100A and the periphery region 100B respectively, and the conductive patterns 190, 192 for example include a low-resistant metal like tungsten, aluminum or copper. Each of the conductive patterns 190, 192 are formed in alignment with each plugs 180, 182 to electrically connect each plugs 180, 182 for serving as a storage node pad (SN pad) of the plugs 180, 182. Each of the conductive patterns 190 preferably only covers each of the plugs 180, 182, to expose the entire spacer structure 170 and the bit lines 160 therefrom, as shown in FIGS. 1-2. In this way, the conductive patterns 190 within the memory cell region 100A may therefore formed in an array arrangement from a top view as shown in FIG. 1, and each of the conductive patterns 190 is alternately arranged with each of the bit lines 160 underneath.

Figure 3:
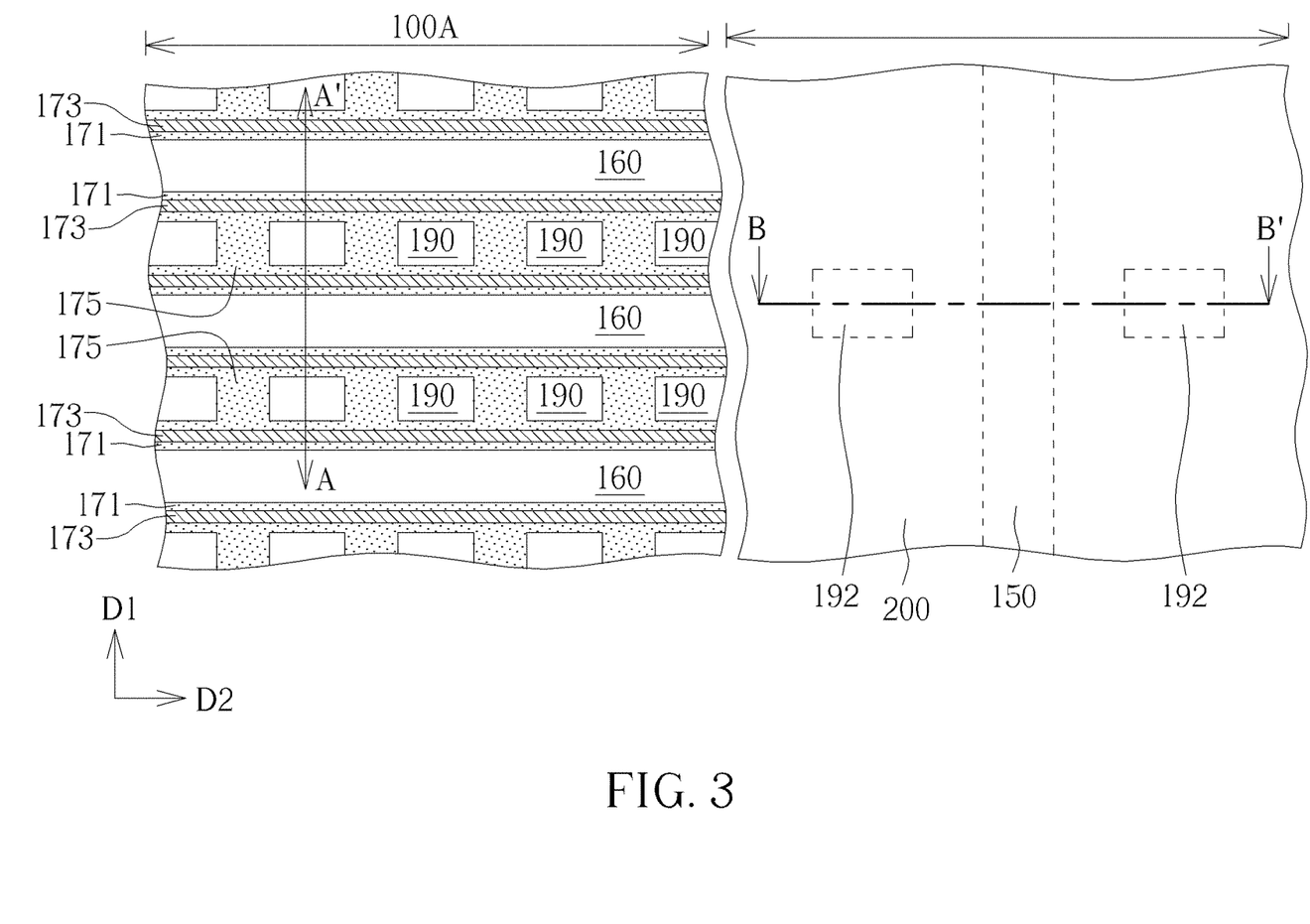
FIG. 3 shows a top view of a semiconductor memory device after forming a mask layer.
Figure 4:
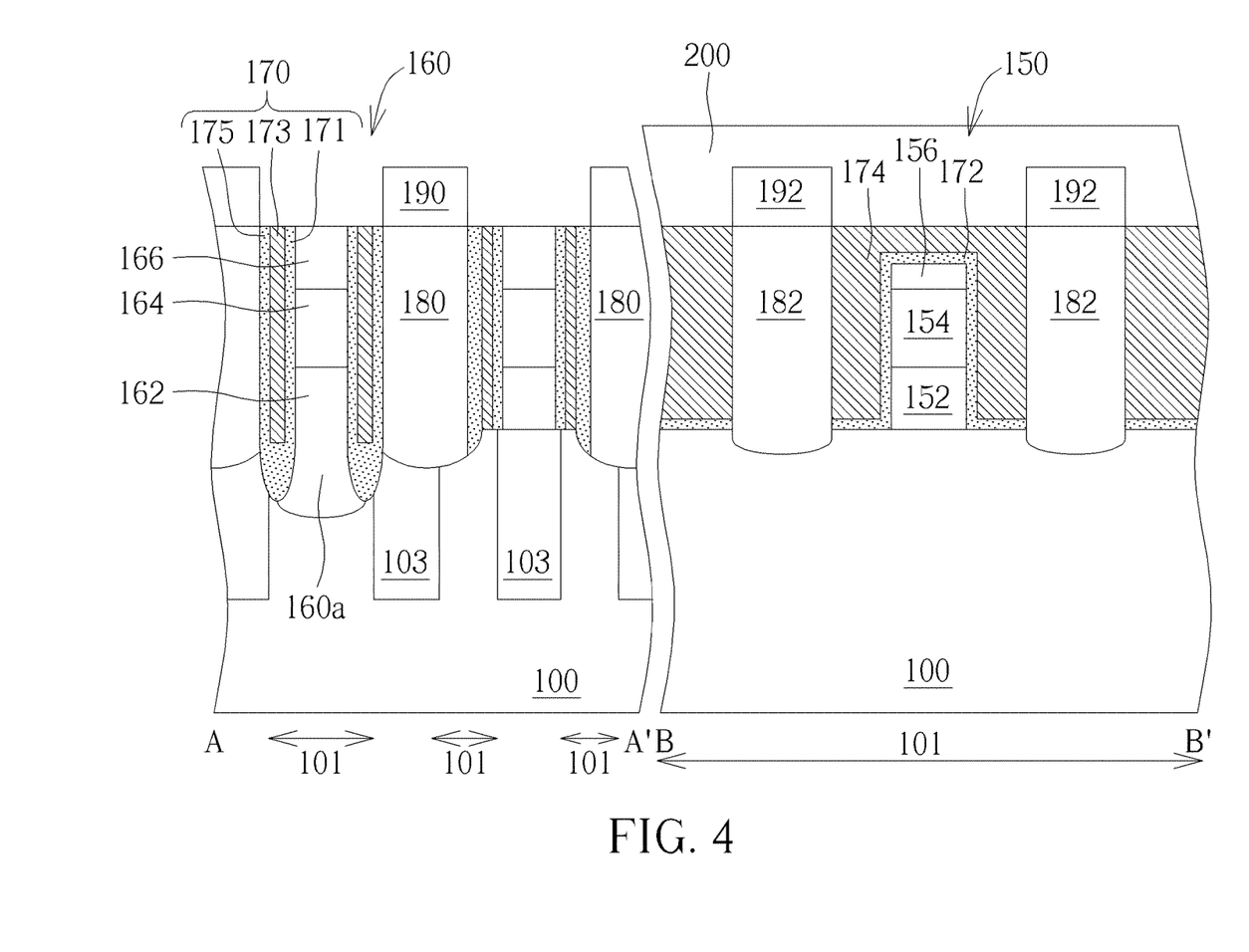
FIG. 4 shows a cross-sectional view of a semiconductor memory device taken along cross lines A-A' and B-B' in FIG. 3.
Figure 5:
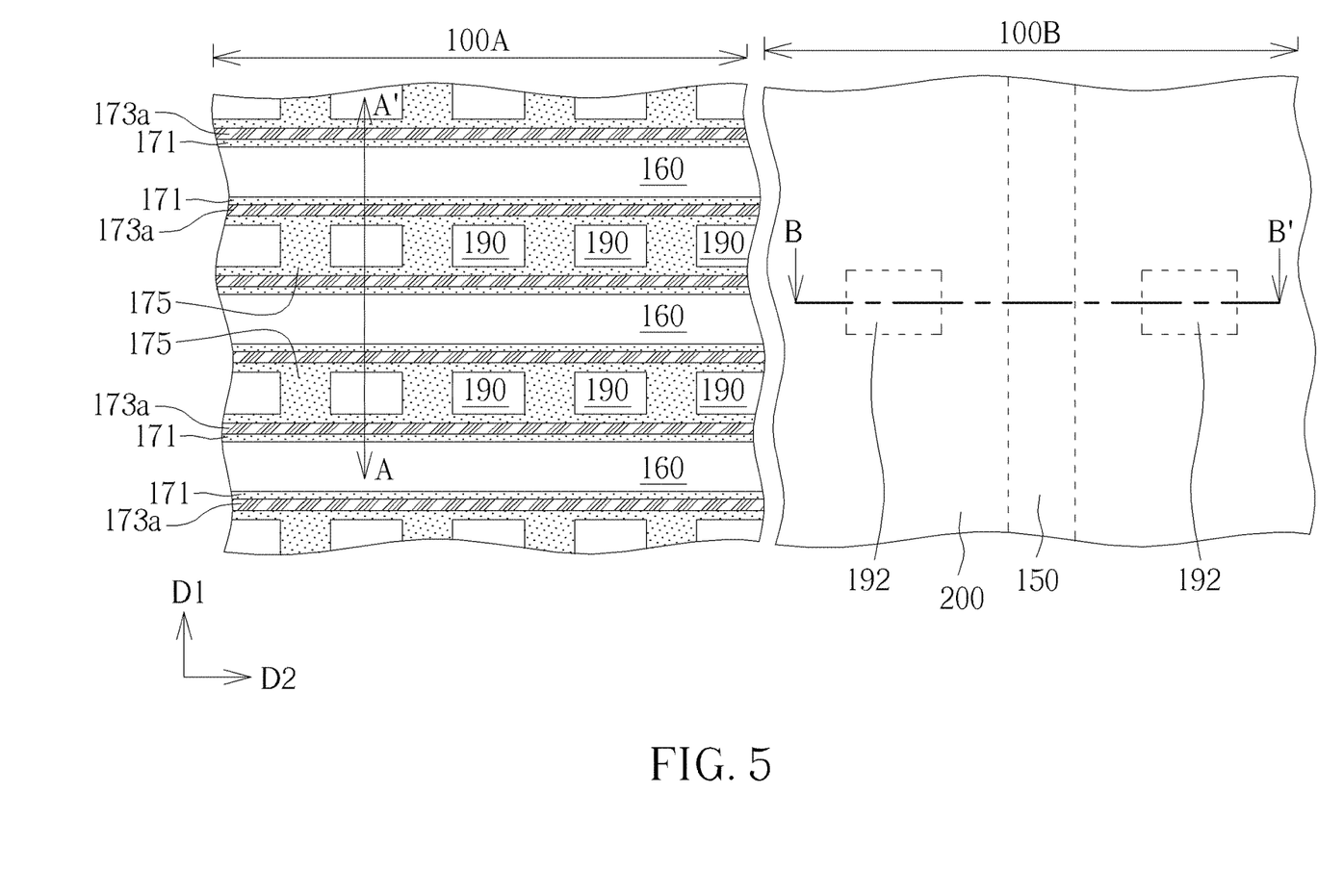
FIG. 5 shows a top view of a semiconductor memory device after performing a chemical reaction.
Figure 6:
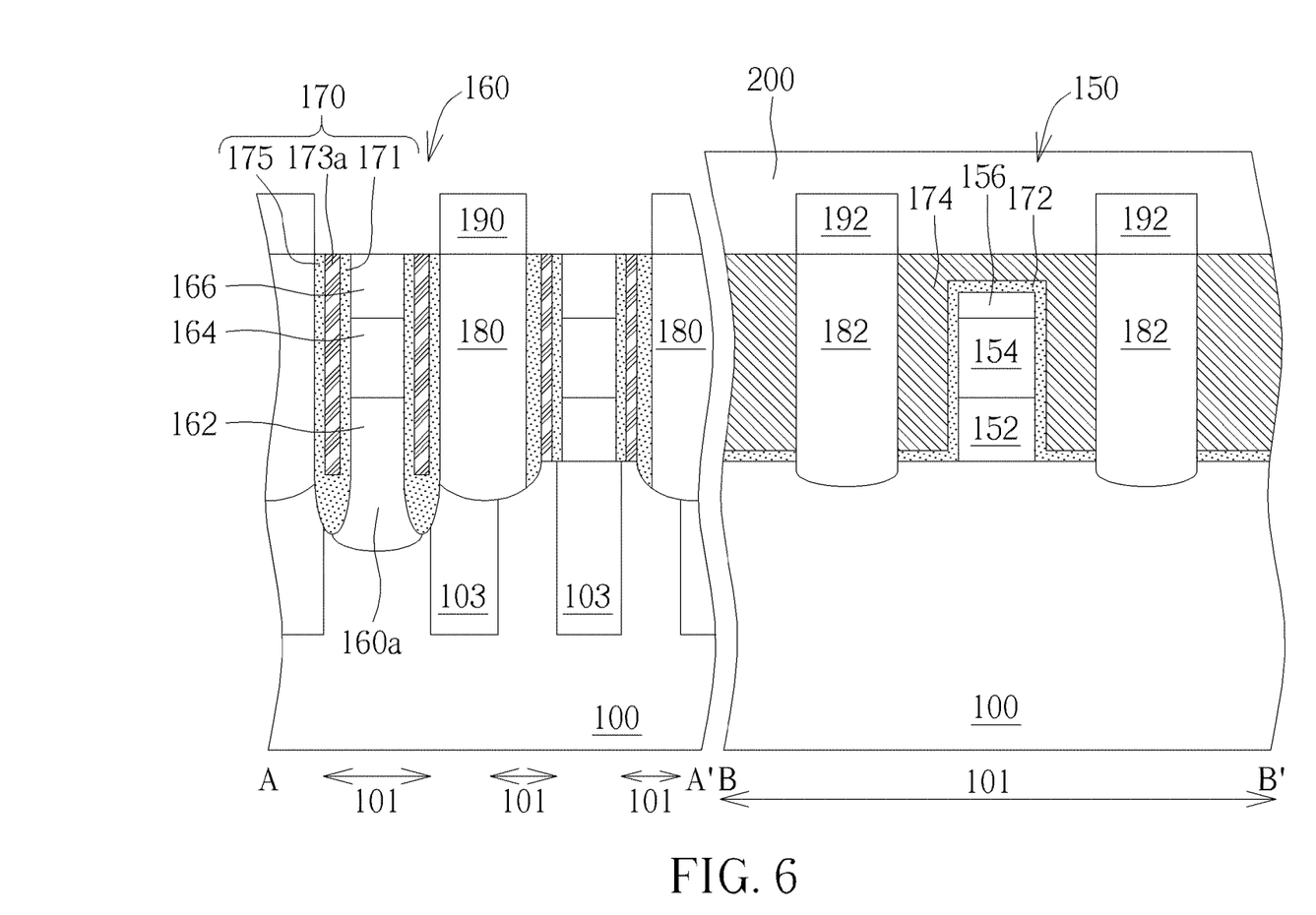
FIG. 6 shows a cross-sectional view of a semiconductor memory device taken along cross lines A-A' and B-B' in FIG. 5.

Then, a mask layer 200 is formed to cover the periphery region 100B, with each bit line 160, the spacer structure 170 and the conductive patterns 190 within the entire memory cell region 100A being exposed from the mask layer 200 as shown in FIGS. 3-4. Following these, a chemical reaction process P1 is performed under the coverage of the mask layer 200, for example by providing a preferably chemical reagent to react with the exposed second spacer 173 of the spacer structure 170 and to transform the exposed second spacer 173. In the present embodiment, the material of the second spacer 173 is changed from original oxide (such as silicon oxide) into non-oxide such as ammonium hexafluorosilicate (($NH_4$)$_2$$SiF_6$), to form a transformed spacer 173a as shown in FIGS. 5-6. In one embodiment, the chemical reaction process P1 is preferably carried out by providing a mixed gas for example including nitrogen gas ($N_2$), hydrogen gas ($H_2$) and nitrogen trifluoride ($NF_3$) gas, with these gases perform the reactions as shown in step 1 and step 2 sequentially to transform the second spacer 173. However, in another embodiment, the chemical reaction process P1 may also be carried out by directly providing ammonium fluoride ($NH_4F$), so that the second spacer 173 may also be transformed by directly performing the reaction of step 2.

Figure 7:
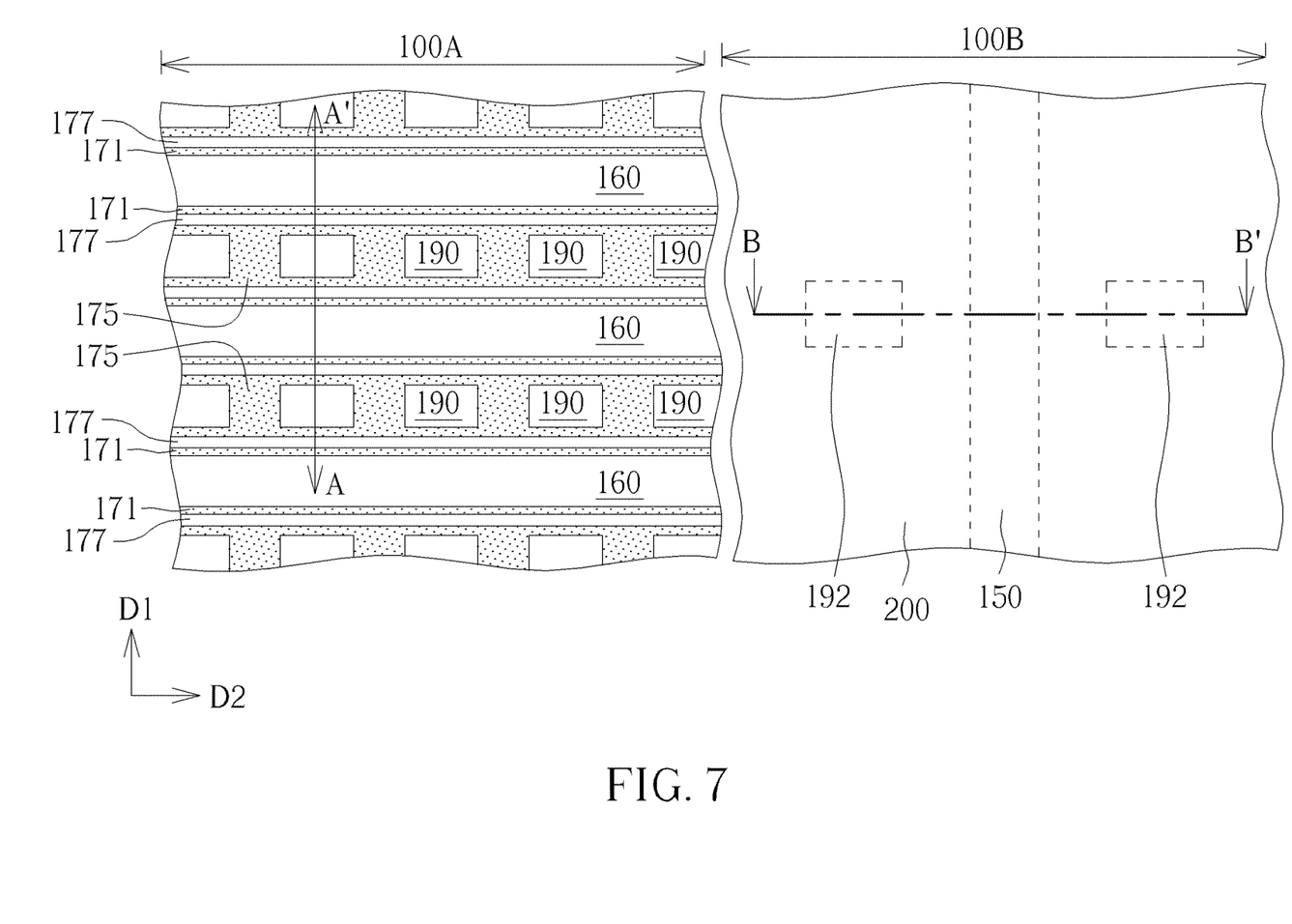
FIG. 7 shows a top view of a semiconductor memory device after performing a heat treatment.
Figure 8:
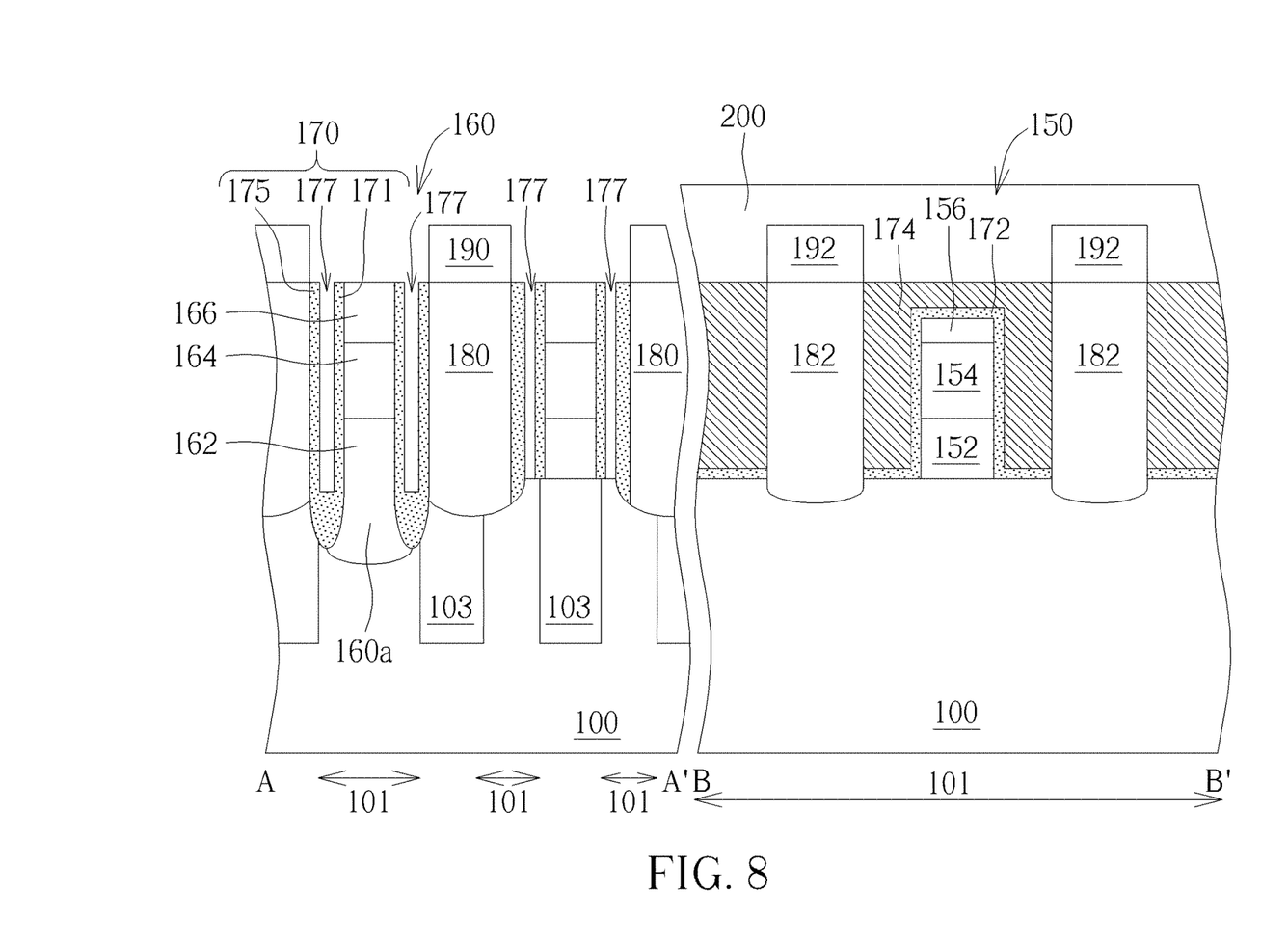
FIG. 8 shows a cross-sectional view of a semiconductor memory device taken along cross lines A-A' and B-B' in FIG. 7.

$NH_3 + NF_3 \rightarrow NH_4F$  Step 1:

$2NH_4F + SiO_2 + 4HF \rightarrow (NH_4)_2SiF_6 + H_2O$  Step 2:

After that, the transformed spacer 173a is completely removed to form an air-gap layer 177, as shown in FIGS. 7-8. In the present embodiment, a heat treatment process P2 is performed after the chemical reaction process P1 also under the coverage of the mask layer 200, so that, the transformed spacer 173a may directly vaporize or volatile to become water vapor for easily removing.

The heat treatment process P2 is preferably performed under a temperature which is suitable for the vaporization of the transformed spacer 173a without affecting the mask layer 200, such as 100° C. to 150° C. but not limited thereto. It is noted that, in general process, an etching process such as a wet etching process is regularly used to form an air-gap layer. However, even the etching selectivity between the second spacer 173 and other spacers 171, 175 is increased, the etching process may still lead possible damages to the spacers 171, 175 and other elements. The method of the present embodiment uses the chemical reaction processes to firstly transform the oxide of second spacer 173 followed by specifically removing the transformed spacer 173a through the heat treatment process, so as to form the air-gap layer 177 without damaging to any elements.

According to above processes, the forming process of a semiconductor memory device according to the preferred embodiment of the present invention is accomplished. In the subsequent processes, the mask layer 200 may be completely removed, an insulating layer (not shown in the drawings) is then formed to cover the spacer structure 170 and the conductive patterns 190, and a capacitor structure is formed to electrically connect to each conductive patterns 190, thereby forming the DRAM device. According to the forming process of the present embodiment, the chemical reaction process P1 and the heat treatment process P2 are formed sequentially under the coverage of the mask layer 200, after the conductive patterns 190 electrically connected to the plugs 180, 182 are formed, so that, the second spacer 173 exposed from the mask layer 200 may firstly react with the chemical reagent to transform into the transformed spacer 173a, and to vaporize or to volatile into water vapor under a high temperature. In this way, the air-gap layer 177 is successfully formed under a simplified process without damaging to any elements.

Overall speaking, the semiconductor memory device of the present invention further performs a two-stepped chemical reaction after forming the SN pads, to firstly transform the particular spacer followed by removing the transformed spacer via a vaporization process. Through this arrangement, the present invention is able to form the air-gap layer in the spacer structure between the bit lines and the storage node contacts, under a simplified process. That is, the RC delay issue may be improved. Also, since the chemical reaction is specifically performed on the particular spacer within the spacer structure, no element may be damage during removing the transformed spacer. That is, the method of the present invention is allowable to form the air-gap layer without causing any damages to any other elements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
    providing a substrate, the substrate comprising a periphery region and a memory cell region;
    forming a plurality of bit lines extended along a first direction on the substrate, within the memory cell region, wherein a spacer structure is formed at two sides of each of the bit lines and the spacer structure comprises a tri-layer structure;
    forming a plurality of first plugs on the substrate within the memory cell region, at two sides of each of the bit lines;
    forming a gate structure on the substrate within the periphery region, the gate structure extended along a second direction being perpendicular to the first direction;
    forming a plurality of conductive patterns, the conductive patterns being in alignment and directly in contact with the first plugs;
    forming a plurality of second plugs on the substrate within the periphery region, the second plugs being electrically connected to two source/drain regions respectively at two sides of the gate structure, wherein the second plugs and the first plugs are formed simultaneously;
    after forming the conductive patterns, performing a chemical reaction process, to transform a second spacer of the tri-layer structure of the spacer structure to form a transformed second spacer; and
    removing the transformed second spacer to form an air-gap layer in the spacer structure.

2. The method of forming a semiconductor memory device according to claim 1, wherein the gate structure and the bit lines are formed simultaneously.

3. The method of forming a semiconductor memory device according to claim 1, wherein the conductive patterns are formed in an array arrangement, and the conductive patterns are electrically connected to the first plugs within the memory cell region and the second plugs within the periphery region.

4. The method of forming a semiconductor memory device according to claim 1, further comprising:
before performing the chemical reaction, forming a mask layer on the substrate within the periphery region, to cover the gate structure and the second plugs.

5. The method of forming a semiconductor memory device according to claim 4, wherein after removing the transformed second spacer, the mask layer is completely removed.

6. The method of forming a semiconductor memory device according to claim 1, wherein the second spacer comprises silicon oxide.

7. The method of forming a semiconductor memory device according to claim 1, wherein the chemical reaction is performed by providing a reagent to transform the second spacer into ammonium hexafluorosilicate.

8. The method of forming a semiconductor memory device according to claim 7, wherein the reagent comprises nitrogen gas, hydrogen gas and nitrogen trifluoride gas.

9. The method of forming a semiconductor memory device according to claim 7, wherein the reagent comprises ammonium fluoride.

10. The method of forming a semiconductor memory device according to claim 1, further comprising:
performing a heat treatment process after the chemical reaction process, to remove the transformed second spacer.

11. The method of forming a semiconductor memory device according to claim 10, wherein the heat treatment process is performed at a temperature ranged from 100 degrees Celsius to 150 degrees Celsius to vaporize the transformed second spacer.

* * * * *